United States Patent
Kim et al.

(10) Patent No.: US 9,966,480 B2
(45) Date of Patent: May 8, 2018

(54) ELECTRODE COMPOSITION, ELECTRODE MANUFACTURED USING THE SAME, AND SOLAR CELL

(71) Applicant: SAMSUNG SDI CO., LTD., Yongin-si, Gyeonggi-do (KR)

(72) Inventors: Dong-Suk Kim, Suwon-si (KR); Ju-Hee Kim, Suwon-si (KR); Young-Ki Park, Suwon-si (KR); Dong-Il Shin, Suwon-si (KR); Seok-Hyun Jung, Suwon-si (KR)

(73) Assignee: Samsung SDI Co., Ltd., Yongin-si, Gyeonggi-do (KR)

( * ) Notice: Subject to any disclaimer, the term of this patent is extended or adjusted under 35 U.S.C. 154(b) by 3 days.

(21) Appl. No.: 15/069,990

(22) Filed: Mar. 15, 2016

(65) Prior Publication Data

US 2016/0322521 A1     Nov. 3, 2016

(30) Foreign Application Priority Data

Apr. 28, 2015   (KR) ......................... 10-2015-0059696
Feb. 24, 2016   (KR) ......................... 10-2016-0022005

(51) Int. Cl.
   *H01B 1/16*      (2006.01)
   *H01B 1/22*      (2006.01)
   *H01L 35/14*      (2006.01)
   *H01L 31/0224*    (2006.01)

(52) U.S. Cl.
CPC ....... *H01L 31/022425* (2013.01); *H01B 1/16* (2013.01); *H01B 1/22* (2013.01); *Y02E 10/50* (2013.01)

(58) Field of Classification Search
CPC ... H01B 1/00; H01B 1/16; H01B 1/22; H01B 31/0224; H01B 35/14; B05D 5/12
See application file for complete search history.

(56) References Cited

U.S. PATENT DOCUMENTS 3,958,996 A * 5/1976 Inskip ................... C08F 291/18
                                                       430/198
4,649,062 A * 3/1987 Kosiorek .............. C08F 290/06
                                                       427/125

(Continued)

FOREIGN PATENT DOCUMENTS

CN            1705044 A      12/2005
CN           102543254 A      7/2012

(Continued)

OTHER PUBLICATIONS

English language machine translation of CN102543254 (pub date Jul. 2012).*

(Continued)

*Primary Examiner* — Mark Kopec
(74) *Attorney, Agent, or Firm* — Lee & Morse, P.C.

(57) ABSTRACT

An electrode composition, including a conductive powder; a glass frit; and an organic vehicle including an organic binder, a multi-functional (meth)acrylate compound, and a solvent, the multi-functional (meth)acrylate compound having a molecular weight of about 200 to about 500, and being present in an amount of about 0.15 wt % to about 2 wt % based on 100 wt % of the electrode composition.

12 Claims, 1 Drawing Sheet

(56) References Cited

U.S. PATENT DOCUMENTS

| | | | | |
|---|---|---|---|---|
| 6,558,874 B2* | 5/2003 | Drozdyk | ............... | G03F 7/0047 430/270.1 |
| 8,129,088 B2* | 3/2012 | Kuroki | ................. | G03F 7/0047 430/270.1 |
| 8,974,704 B2* | 3/2015 | Kim | ........................ | C03C 8/10 136/252 |
| 9,039,937 B1* | 5/2015 | Jung | ........................ | C09D 5/24 252/500 |
| 2013/0160836 A1* | 6/2013 | Kojo | ............... | H01L 31/022425 136/256 |

FOREIGN PATENT DOCUMENTS

| | | |
|---|---|---|
| CN | 102956283 A | 3/2013 |
| JP | 2012-044142 A | 3/2012 |
| JP | 2014-207262 A | 10/2014 |
| KR | 10-0846306 B1 | 7/2008 |
| KR | 10-2009-0128082 A | 12/2009 |
| KR | 10-2011-0049222 A | 5/2011 |
| KR | 10-2012-0008135 A | 1/2012 |
| KR | 10-2013-0136725 A | 12/2013 |
| KR | 10-2014-0017052 A | 2/2014 |
| KR | 10-1431509 B1 | 8/2014 |
| KR | 10-2014-0143294 A | 12/2014 |
| TW | 201115593 A | 5/2011 |
| TW | 201503170 A | 1/2015 |
| TW | 201505035 A | 2/2015 |
| TW | 201515021 A | 4/2015 |

OTHER PUBLICATIONS

Miwon e-brochure "Energy Curing Products" (14 pages) miramar.com (2017).*

Office Action dated Mar. 8, 2017 of the corresponding Chinese Patent Application No. 201610197376.5.

Office Action dated Feb. 3, 2017 of the corresponding Taiwanese Patent Application No. 105110974.

Chinese Office Action dated Nov. 9, 2017, (No English language translation provided).

* cited by examiner

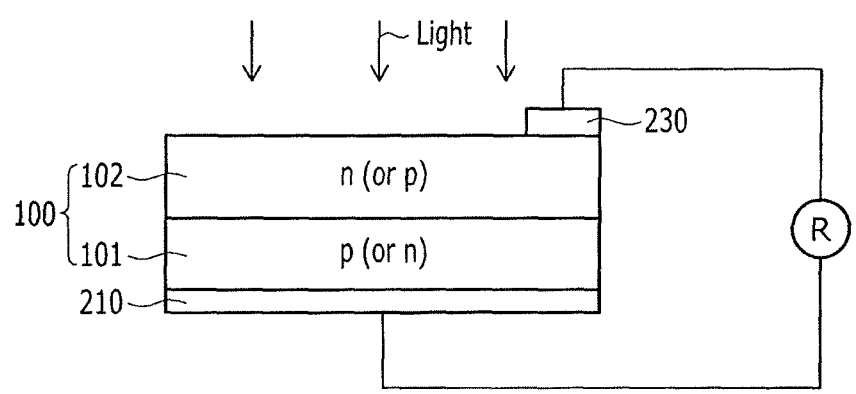

ELECTRODE COMPOSITION, ELECTRODE MANUFACTURED USING THE SAME, AND SOLAR CELL

CROSS-REFERENCE TO RELATED APPLICATION

Korean Patent Application Nos. 10-2015-0059696 and 10-2016-0022005, filed on Apr. 28, 2015, and Feb. 24, 2016, respectively, in the Korean Intellectual Property Office, and both entitled: "Electrode Composition, Electrode Manufactured Using the Same, and Solar Cell," are incorporated by reference herein in its entirety.

BACKGROUND

1. Field

Embodiments relate to an electrode composition, an electrode manufactured therefrom, and a solar cell.

2. Description of the Related Art

Solar cells may generate electrical energy using the photovoltaic effect of a p-n junction which may convert photons of sunlight into electricity. In the solar cell, front and rear electrodes may be formed on front and rear surfaces of a semiconductor wafer or substrate with the p-n junction, respectively. Then, the photovoltaic effect of the p-n junction may be induced by sunlight entering the semiconductor wafer and electrons generated by the photovoltaic effect of the p-n junction may provide an electric current to the outside through the electrodes.

SUMMARY

Embodiments may be realized by providing an electrode composition, including a conductive powder; a glass frit; and an organic vehicle including an organic binder, a multi-functional (meth)acrylate compound, and a solvent, the multi-functional (meth)acrylate compound having a molecular weight of about 200 to about 500, and being present in an amount of about 0.15 wt % to about 2 wt % based on 100 wt % of the electrode composition.

The multi-functional (meth)acrylate compound may be one or more of a di(meth)acrylate compound, a tri(meth)acrylate compound, or a tetra(meth)acrylate compound.

The multi-functional (meth)acrylate compound may be one or more of trimethylolpropane tri(meth)acrylate, ethylene glycol di(meth)acrylate, triethylene glycol di(meth)acrylate, butanediol di(meth)acrylate, hexanediol di(meth)acrylate, pentaerythritol tri(meth)acrylate, trimethylol tri(meth)acrylate, or pentaerythritol tetra(meth)acrylate.

The multi-functional (meth)acrylate compound may be present in an amount of about 0.2 wt % to about 2 wt % based on 100 wt % of the electrode composition.

The molecular weight of the multi-functional (meth)acrylate compound may be about 250 to about 400.

The multi-functional (meth)acrylate compound may remain in a resultant film after heat treatment at about 200° C. to about 400° C.

The glass frit may be one or more of a bismuth-based glass frit or a lead-based glass frit.

The bismuth-based glass frit may be bismuth (Bi)-tellurium (Te) glass frit.

The bismuth (Bi)-tellurium (Te) glass frit may include about 20 to about 80 mol % of tellurium oxide and about 20 to about 80 mol % of bismuth oxide.

The electrode composition may include about 60 to about 95 wt % of the conductive powder, about 0.5 to about 20 wt % of the glass frit, and about 1 to about 30 wt % of the organic vehicle.

The electrode composition may further include at least one additive selected from a surface-treatment agent, a dispersing agent, a thixotropic agent, a plasticizer, a viscosity stabilizer, an antifoaming agent, a pigment, an ultraviolet (UV) stabilizer, an antioxidant, and a coupling agent.

Embodiments may be realized by providing an electrode manufactured using the electrode composition.

Embodiments may be realized by providing a solar cell, including an electrode manufactured using the electrode composition.

BRIEF DESCRIPTION OF THE DRAWING

Features will become apparent to those of skill in the art by describing in detail exemplary embodiments with reference to the attached drawings in which:

The FIGURE illustrates a schematic view of a structure of a solar cell according to an embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

An embodiment may provide an electrode composition including: a conductive powder; glass frit; and an organic vehicle including an organic binder, a multi-functional (meth)acrylate compound, and a solvent.

The electrode composition may include a metal powder as a conductive powder. The metal powder may include, for example, silver (Ag), gold (Au), palladium (Pd), platinum (Pt), ruthenium (Ru), rhodium (Rh), osmium (Os), iridium (Ir), rhenium (Re), titanium (Ti), niobium (Nb), tantalum (Ta), aluminum (Al), copper (Cu), nickel (Ni), molybdenum (Mo), vanadium (V), zinc (Zn), magnesium (Mg), yttrium (Y), cobalt (Co), zirconium (Zr), iron (Fe), tungsten (W), tin (Sn), chromium (Cr), or manganese (Mn).

The particle size of the conductive powder may be nanometer or micrometer scale. For example, the conductive powder may have a particle size of dozens to several hundred nanometers, or several to dozens of micrometers. In embodiments, the conductive powder may be a mixture of two or more types of silver powders having different particle sizes.

The conductive powder may have a particle shape of a spherical shape, a sheet-shape, or an amorphous shape. The conductive powder may have an average particle diameter (D50) of about 0.1 µm to about 10 µm, for example about 0.5 µm to about 5 µm. The average particle diameter may be measured using, for example, a Model 1064D (CILAS Co., Ltd.) equipment after dispersing the conductive powder in isopropyl alcohol (IPA) at room temperature (about 24° C. to about 25° C.) for 3 minutes via ultrasonication. Within this range of average particle diameter, the composition may provide low contact resistance and low line resistance.

The conductive powder may be present in an amount of about 60 wt % to about 95 wt % based on 100 wt % of the electrode composition. Within this range, deterioration in conversion efficiency due to, for example, an increase in resistance, may be prevented and hard formation of paste caused by a relative decrease of an organic vehicle may also be prevented. In an embodiment, the conductive powder may be present in an amount of about 70 wt % to about 90 wt %.

The glass frit may serve to enhance adhesion between the conductive powder and the wafer or the substrate and to form silver crystal grains in an emitter region by etching an anti-reflection layer and melting the conductive powder so as to reduce contact resistance during a firing process of the electrode paste. During the sintering process, the glass frit may be softened and may decrease the firing temperature.

When the area of the solar cell is increased in order to improve solar cell efficiency, contact resistance of the solar cell may be increased, and it may be desirable to minimize the influence on the p-n junction while minimizing series resistance ($R_s$). The firing temperature may vary within a broad range with increasing use of various wafers having different sheet resistances. It may be desirable for the glass frit to secure sufficient thermal stability to withstand a wide range of firing temperatures.

The glass frit may be one or more of lead glass frit and lead-free glass frit which may be used in an electrode composition.

The glass frit may be one or more of a bismuth-based glass frit or a lead-based glass frit.

The glass frit may further include at least one element selected from lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al).

The bismuth-based glass frit may be bismuth (Bi)-tellurium (Te) glass frit.

The bismuth (Bi)-tellurium (Te) glass frit may include about 20 to about 80 mol % of tellurium oxide and about 20 to about 80 mol % of bismuth oxide. When the tellurium and the bismuth are used within the ranges, excellent conversion efficiency of a solar cell and adhesion strength of an electrode pattern may be simultaneously secured.

The glass frit may be prepared from oxides of the elements by any suitable method. For example, the oxides of the elements may be obtained by mixing the oxides of the elements in a predetermined ratio, melting the mixture, quenching the resultant product, and then pulverizing the quenched product. Mixing may be performed using a ball mill or a planetary mill. The melting may be performed at about 700° C. to about 1300° C. and the quenching may be performed at room temperature (about 24° C. to about 25° C.). The pulverizing may be performed using, for example, a disk mill or a planetary mill.

The glass frit may have an average particle diameter (D50) of about 0.1 μm to about 10 μm, and may be present in an amount of about 0.5 wt % to about 20 wt % based on 100 wt % of the electrode composition. Within this range, the glass fit may secure excellent adhesive strength of an electrode pattern while not deteriorating electrical characteristics of an electrode.

The glass frit may have a spherical shape or an amorphous shape.

In an embodiment, two different kinds of glass frit having different transition temperatures may be used. For example, a first glass frit having a transition temperature ranging from greater than or equal to about 200° C. to less than or equal to about 350° C. and a second glass frit having a transition temperature ranging from greater than about 350° C. to less than or equal to about 550° C. may be mixed in a weight ratio ranging from about 1:0.2 to about 1:1.

The organic vehicle may impart suitable viscosity and rheological characteristics for printing to the electrode composition through mechanical mixing with the inorganic component of the electrode composition. The organic vehicle may include an organic binder, a multi-functional (meth)acrylate compound, and a solvent.

The organic binder may be selected from acrylate-based resins or cellulose-based resins. In an embodiment, the organic binder may be selected from ethyl cellulose, ethyl hydroxyethylcellulose, nitrocellulose, a mixture of ethylcellulose and phenolic resins, alkyd resins, phenol-based resins, acrylate ester-based resins, xylene-based resins, polybutene-based resins, polyester-based resins, urea-based resins, melamine-based resins, vinyl acetate-based resins, wood rosin, or polymethacrylates of alcohols.

The organic bindermay have a weight average molecular weight (Mw) of about 30,000 to about 200,000 g/mol, for example about 40,000 to about 150,000 g/mol. When the weight average molecular weight (Mw) is within the range, an excellent effect in term of printability may be obtained.

The multi-functional (meth)acrylate compound may have at least two acrylate groups or methacrylate groups. For example, a mono-functional (meth)acrylate compound may be excluded. The multi-functional (meth)acrylate compound may beone or more of a di(meth)acrylate compound, a tri(meth)acrylate compound, or a tetra(meth)acrylate compound. The multi-functional (meth)acrylate compound may beone or more of trimethylolpropane tri(meth)acrylate, ethylene glycoldi(meth)acrylate, triethylene glycol di(meth)acrylate, butanediol di(meth)acrylate, hexanedioldi(meth)acrylate, pentaerythritol tri(meth)acrylate, trimethylol tri(meth)acrylate, or pentaerythritol tetra(meth)acrylate.

The multi-functional (meth)acrylate compound may have a molecular weight of about 200 to about 500, for example about 250 to about 400 or about 250 to about 360. When the multi-functional (meth)acrylate compound has a molecular weight within the range, efficiency may be improved by securing satisfactory continuous printability, and a series resistance ($R_s$) increase may be minimized.

The multi-functional (meth)acrylate compound may not be thermally cured after a heat treatment at about 200° C. to about 400° C., but may remain in the resultant film. For example, the multi-functional (meth)acrylate compound may not be thermally cured after the heat treatment but may remain in the resultant film and may play a role of improving adherence of a substrate to a pattern.

The multi-functional (meth)acrylate compound may be present in an amount of about 0.15 wt % to about 2 wt %, for example about 0.2 wt % to about 2 wt %, based on 100 wt % of the electrode composition. When the multi-functional (meth)acrylate compound is used within the range, continuous printability of an electrode composition may be improved, and an adhesion force between an electrode pattern and a substrate may be improved.

The solvent may be, for example, hexane, toluene, Texanol™ (2,2,4-trimethyl-1,3-pentanediol monoisobutyrate), methyl cellosolve, ethyl cellosolve, cyclohexanone, butyl cellosolve, aliphatic alcohol, butyl carbitol(diethylene glycol monobutyl ether), dibutyl carbitol(diethylene glycol dibutyl ether), butyl carbitol acetate(diethylene glycol monobutyl ether acetate), propylene glycol monomethyl ether, hexylene glycol, terpineol, methylethylketone, benzylalcohol, gammabutyrolactone, ethyllactate, or a combination thereof.

The organic vehicle may be present in an amount of about 1 to about 30 wt %, for example about 5 to about 15 wt % based on 100 wt % of the electrode composition. When the organic vehicle is used within the range, adhesion strength between an electrode pattern and a substrate may be improved, and excellent continuous printability may be secured.

The electrode composition may further include additives, for example, to enhance flow properties, process properties, and stability. The additives may include, for example, a surface-treatment agent, a dispersing agent, a thixotropic agent, a plasticizer, a viscosity stabilizer, an antifoaming agent, a pigment, an ultraviolet (UV) stabilizer, an antioxidant, or a coupling agent. These additives may be used alone or as mixtures thereof.

These additives may be present in an amount of about 0.1 to about 5 wt % based on 100 wt % of the electrode composition. This amount may be changed as desired. The amount of the additive may be selected, considering printing characteristics, dispersion, and storage stability of an electrode composition.

An embodiment may provide an electrode formed from the electrode composition.

The electrode may be formed as a predetermined pattern on the surface of a wafer by coating the electrode composition and then patterning and firing it. The coating of the electrode composition may be, for example, screen printing, gravure offset, rotary screen printing, or lift-off. The coated electrode composition may have a predetermined pattern and a thickness ranging from about 10 μm to about 40 μm.

The firing of the patterned electrode composition is illustrated in the following process of a solar cell in detail.

According to an embodiment, a solar cell including the electrode may be provided. Referring to the FIGURE, a solar cell according to an embodiment is illustrated. The FIGURE illustrates a schematic view of the structure of the solar cell according to an embodiment.

Referring to the FIGURE, a rear electrode 210 and a front electrode 230 may be formed by printing an electrode composition on a substrate 100 including a p layer (or an n layer) 101 and an n layer (or a p layer) 102 as an emitter and then firing it. For example, the electrode composition may be print-coated on the rear side of the substrate 100 and heat-treating it at about 200° C. to about 400° C. for about 10 to about 60 seconds to perform a prior preparation step for the rear electrode. Herein, a multi-functional (meth) acrylate compound may not be thermally cured but may remain in the electrode composition after the heat treatment.

A prior preparation step for the front electrode may be performed by printing the electrode composition on the front surface of the substrate 100 and then drying it. Then, the electrode composition may be fired at about 400° C. to about 980° C., for example, about 700° C. to about 980° C., for about 30 seconds to about 210 seconds to form the front and rear electrodes.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Examples 1 to 7 and Comparative Examples 1 to 11

An electrode composition was prepared by sufficiently dissolving an organic binder (Dow Chemical Company, STD4, Mw=50,000 g/mol) and Texanol (Eastman) at 60° C., adding spherical shaped silver powder having an average particle diameter of 2.0 μm (AG-5-11F, Dowa Hightech Co. Ltd.), lead-free Bi—Te glass frit having an average particle diameter of 1.0 μm (ABT-1, Asahi glass Co. Ltd.), a (meth) acrylate compound, a dispersing agent (BYK-102, BYK-Chemie), and a thixotropic agent (Thixatrol ST, Elementis Co.) thereto, mixing them, and dispersing the mixture with a three roll mill.

The (meth)acrylate compound may be the following compound made by Miwon Specialty Chemical Co., Ltd.

(A) Phenol (EO)4 Acrylate (Miramer M4144, molecular weight=324) of a mono-functional acrylate compound, (B) Polyethylene glycol 200 Diacrylate (Miramer M282, molecular weight=308) of a bifunctional acrylate compound, (C) Pentaerythritol triacrylate (Miramer M340, molecular weight=298) of a trifunctional acrylate compound, (D) Pentaerythritol Tetraacrylate (Miramer M420, molecular weight=352) of a tetrafunctional acrylate compound, and (E) Trimethylolpropane (EO)15 (Miramer M3150, molecular weight=956) of a trifunctional acrylate compound were used.

The amount (wt %) of each component is provided in the following Table 1.

TABLE 1

|  |  | Ag powder | Binder | Solvent | Glass frit | Acrylate compound ||||| Dispersing agent | Thixotropic agent |
|  |  |  |  |  |  | (A) | (B) | (C) | (D) | (E) |  |  |
| --- | --- | --- | --- | --- | --- | --- | --- | --- | --- | --- | --- | --- |
| Examples | 1 | 89.00 | 0.50 | 6.45 | 2.50 | — | 0.75 | — | — | — | 0.40 | 0.40 |
|  | 2 | 89.00 | 0.50 | 6.45 | 2.50 | — | — | 0.75 | — | — | 0.40 | 0.40 |
|  | 3 | 89.00 | 0.50 | 6.45 | 2.50 | — | — | — | 0.75 | — | 0.40 | 0.40 |
|  | 4 | 89.00 | 0.50 | 7.00 | 2.50 | — | — | 0.20 | — | — | 0.40 | 0.40 |
|  | 5 | 89.00 | 0.50 | 6.10 | 2.50 | — | — | 1.10 | — | — | 0.40 | 0.40 |
|  | 6 | 89.00 | 0.50 | 5.70 | 2.50 | — | — | 1.50 | — | — | 0.40 | 0.40 |
|  | 7 | 89.00 | 0.50 | 5.20 | 2.50 | — | — | 2.00 | — | — | 0.40 | 0.40 |
| Comparative Examples | 1 | 89.00 | 0.50 | 7.20 | 2.50 | — | — | — | — | — | 0.40 | 0.40 |
|  | 2 | 89.00 | 0.50 | 6.45 | 2.50 | 0.75 | — | — | — | — | 0.40 | 0.40 |
|  | 3 | 89.00 | 0.50 | 7.10 | 2.50 | 0.10 | — | — | — | — | 0.40 | 0.40 |
|  | 4 | 89.00 | 0.50 | 4.70 | 2.50 | 2.50 | — | — | — | — | 0.40 | 0.40 |
|  | 5 | 89.00 | 0.50 | 7.10 | 2.50 | — | 0.10 | — | — | — | 0.40 | 0.40 |
|  | 6 | 89.00 | 0.50 | 4.70 | 2.50 | — | 2.50 | — | — | — | 0.40 | 0.40 |
|  | 7 | 89.00 | 0.50 | 7.10 | 2.50 | — | — | 0.10 | — | — | 0.40 | 0.40 |

TABLE 1-continued

| | Ag powder | Binder | Solvent | Glass frit | Acrylate compound (A) | (B) | (C) | (D) | (E) | Dispersing agent | Thixotropic agent |
|---|---|---|---|---|---|---|---|---|---|---|---|
| 8 | 89.00 | 0.50 | 4.70 | 2.50 | — | — | 2.50 | — | — | 0.40 | 0.40 |
| 9 | 89.00 | 0.50 | 7.10 | 2.50 | — | — | — | 0.10 | — | 0.40 | 0.40 |
| 10 | 89.00 | 0.50 | 4.70 | 2.50 | — | — | — | 2.50 | — | 0.40 | 0.40 |
| 11 | 89.00 | 0.50 | 6.45 | 2.50 | — | — | — | — | 0.75 | 0.40 | 0.40 |

Printability Evaluation of Electrode Pattern

The electrode compositions according to Examples 1 to 7 and Comparative Examples 1 to 11 were respectively coated on the front side of a wafer, and the number of broken lines of the printed electrode was counted with the naked eye and evaluated according to the following reference. The results are provided in the following Table 2.

Adhesion Force Evaluation of Electrode Pattern

The electrode compositions according to Examples 1 to 7 and Comparative Examples 1 to 11 were respectively printed on the front surface of a wafer by using a 400 mesh screen having a square size of 5 cm×5 cm and dried at 300 to 400° C. to manufacture each sample. Each sample was evaluated for adhesion force by making 100 lattice patterns with a crosscut knife according to a lattice adhesion evaluation (ASTM D3359), attaching and detaching a metal-adhesion tape (#610, 3M) thereto and therefrom, and converting the number of detached lattices with the tape according to the following reference. The results are provided in the following Table 2.

TABLE 2

| | Printability | Adhesion force |
|---|---|---|
| Example 1 | less than 6 | greater than or equal to 5% to less than 15% |
| Example 2 | less than 3 | less than 5% |
| Example 3 | less than 6 | less than 5% |
| Example 4 | less than 3 | greater than or equal to 5% to less than 15% |
| Example 5 | less than 6 | less than 5% |
| Example 6 | less than 6 | less than 5% |
| Example 7 | less than 6 | 0% |
| Comparative Example 1 | 0 | greater than or equal to 65% |
| Comparative Example 2 | less than 6 | greater than or equal to 15% to less than 35% |
| Comparative Example 3 | 0 | greater than or equal to 35% to less than 65% |
| Comparative Example 4 | greater than or equal to 20 | greater than or equal to 5% to less than 15% |
| Comparative Example 5 | 0 | greater than or equal to 35% to less than 65% |
| Comparative Example 6 | greater than or equal to 20 | less than 5% |
| Comparative Example 7 | 0 | greater than or equal to 35% to less than 65% |
| Comparative Example 8 | greater than or equal to 20 | 0% |
| Comparative Example 9 | 0 | greater than or equal to 35% to less than 65% |
| Comparative Example 10 | greater than or equal to 20 | 0% |
| Comparative Example 11 | less than 12 | less than 5% |

Referring to Table 2, the electrode patterns respectively formed of the electrode compositions according to Comparative Examples 1, 2, 3, 5, 7, and 9 showed insufficient adhesion force compared with the electrode patterns respectively formed of the electrode compositions according to Examples 1 to 7. The electrode patterns respectively formed of the electrode compositions according to Comparative Examples 4, 6, 8, 10, and 11 showed satisfactory adhesion force but lacked printability, and $R_s$ was increased, which may have an adverse effect on efficiency. The electrode patterns respectively formed of the electrode compositions according to Example 1 to 7 showed excellent adhesion force and secured sufficient printability, and contributed to improving efficiency.

Electrical Efficiency Evaluation of Solar Cell

Each electrode composition according to Examples 1 to 7 and Comparative Examples 1 to 11 was screen-printed on a front side of a wafer (a multi crystalline wafer obtained by texturing a p-type wafer on the front surface doped with boron, forming an $n^+$ layer with $POCl_3$ thereon, and an anti-reflection coating layer with silicon nitride (SiNx:H)) to form a predetermined pattern, and dried at 300 to 400° C. by using an infrared ray drying furnace. Then, an aluminum paste was printed on the rear side of the wafer in the same method as above and dried. A cell obtained in the process was then fired at 400 to 900° C. in a belt-type furnace for 30 seconds to 50 seconds to manufacture test cells.

Electrical characteristics of the test cell (fill factor and efficiency, Isc) were then measured by using solar cell efficiency-measuring equipment (CT-801, manufactured by Pasan SA). The results are provided in the following Table 3.

TABLE 3

| | $I_{sc}$ (A) | FF (%) | Efficiency (%) |
|---|---|---|---|
| Example 1 | 9.2946 | 77.93 | 19.31 |
| Example 2 | 9.3091 | 76.09 | 19.34 |
| Example 3 | 9.3045 | 77.08 | 19.16 |
| Example 4 | 9.2985 | 76.78 | 19.22 |
| Example 5 | 9.2860 | 77.44 | 19.30 |
| Example 6 | 9.2932 | 75.65 | 19.42 |
| Example 7 | 9.3012 | 77.20 | 19.20 |
| Comparative Example 1 | 9.1530 | 50.28 | 12.35 |
| Comparative Example 2 | 9.2837 | 76.26 | 19.15 |
| Comparative Example 3 | 9.2885 | 74.22 | 18.55 |
| Comparative Example 4 | 9.1107 | 70.30 | 16.94 |
| Comparative Example 5 | 9.2890 | 83.80 | 18.72 |
| Comparative Example 6 | 9.1604 | 68.41 | 16.61 |
| Comparative Example 7 | 9.3010 | 73.50 | 18.62 |
| Comparative Example 8 | 9.1640 | 66.05 | 16.02 |
| Comparative Example 9 | 9.2880 | 74.60 | 18.51 |
| Comparative Example 10 | 9.1350 | 67.45 | 16.33 |
| Comparative Example 11 | 9.2151 | 82.56 | 17.69 |

Referring to Table 3, solar cells manufactured by the electrode compositions according to Examples 1 to 7 showed satisfactory FF and efficiency compared with solar cells manufactured by the electrode compositions according to Comparative Examples 1 to 11.

By way of summation and review, electrodes of a solar cell may be formed with predetermined patterns on the surface of the wafer by coating, patterning, and firing an electrode composition. The conversion efficiency of the solar cell may be improved by improving contact properties of electrodes with the substrate, and minimizing contact resistance ($R_c$) and series resistance ($R_s$), or adjusting pattern line widths of a screen mask with an organic material to be smaller, and forming fine lines and increasing a shortcut current ($I_{sc}$). However, the method of reducing line widths of the electrode pattern with the screen mask may lead to increasing series resistance ($R_c$) and deteriorating continuous printability of a fine pattern.

The electrode patterns on the substrate may be connected one another through a ribbon and attached to the substrate during a process of being manufactured into a final module, but when the electrode patterns are delaminated from the substrate, an electricity-connection drawback may occur, and reliability may be deteriorated. Accordingly, an electrode composition capable of securing printability and improving adhesion of an electrode pattern during formation of the electrode pattern may be required.

An embodiment may provide an electrode composition having excellent continuous printability and capable of increasing adhesion force of a substrate with an electrode pattern, and improving efficiency and reliability of a solar cell. An embodiment may provide an electrode manufactured using the electrode composition. An embodiment may provide a solar cell including the electrode.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An electrode composition to form an electrode in which a multi-functional (meth)acrylate compound in the electrode composition remains uncured in the electrode, the electrode composition consisting essentially of:
    a conductive powder;
    a glass frit;
    an organic vehicle including an organic binder, a multi-functional (meth)acrylate compound, and a solvent, and
    at least one additive selected from a surface-treatment agent, a dispersing agent, a thixotropic agent, a plasticizer, a viscosity stabilizer, an antifoaming agent, a pigment, an ultraviolet (UV) stabilizer, an antioxidant, and a coupling agent;
    the organic binder having a weight average molecular weight of about 30,000 to about 150,000 and the multi-functional (meth)acrylate compound having a molecular weight of about 200 to about 500, the multi-functional (meth)acrylate compound being present in an amount of about 0.15 wt % to about 2 wt % based on 100 wt % of the electrode composition.

2. The electrode composition as claimed in claim 1, wherein the multi-functional (meth)acrylate compound is one or more of a di(meth)acrylate compound, a tri(meth)acrylate compound, or a tetra(meth)acrylate compound.

3. The electrode composition as claimed in claim 1, wherein the multi-functional (meth)acrylate compound is one or more of trimethylolpropane tri(meth)acrylate, ethylene glycol di(meth)acrylate, triethylene glycol di(meth)acrylate, butanediol di(meth)acrylate, hexanediol di(meth)acrylate, pentaerythritol tri(meth)acrylate, trimethylol tri(meth)acrylate, or pentaerythritol tetra(meth)acrylate.

4. The electrode composition as claimed in claim 1, wherein the multi-functional (meth)acrylate compound is present in an amount of about 0.2 wt % to about 2 wt % based on 100 wt % of the electrode composition.

5. The electrode composition as claimed in claim 1, wherein the molecular weight of the multi-functional (meth)acrylate compound is about 250 to about 400.

6. The electrode composition as claimed in claim 1, wherein the multi-functional (meth)acrylate compound remains in a resultant film after heat treatment at about 200° C. to about 400° C.

7. The electrode composition as claimed in claim 1, wherein the glass frit is one or more of a bismuth-based glass frit or a lead-based glass fit.

8. The electrode composition as claimed in claim 7, wherein the bismuth-based glass frit is bismuth (Bi)-tellurium (Te) glass frit.

9. The electrode composition as claimed in claim 8, wherein the bismuth (Bi)-tellurium (Te) glass frit includes about 20 to about 80 mol % of tellurium oxide and about 20 to about 80 mol % of bismuth oxide.

10. The electrode composition as claimed in claim 1, wherein the electrode composition includes about 60 to about 95 wt % of the conductive powder, about 0.5 to about 20 wt % of the glass fit, and about 1 to about 30 wt % of the organic vehicle.

11. An electrode manufactured using the electrode composition as claimed in claim 1, the electrode including the multi-functional (meth)acrylate compound in an uncured state in the electrode.

12. A solar cell, comprising the electrode as claimed in claim 11.

* * * * *